US011300646B2

(12) United States Patent
Isogawa et al.

(10) Patent No.: US 11,300,646 B2
(45) Date of Patent: Apr. 12, 2022

(54) MAGNETIC RESONANCE IMAGING APPARATUS, IMAGE PROCESSING APPARATUS, AND IMAGE PROCESSING METHOD

(71) Applicant: TOSHIBA MEDICAL SYSTEMS CORPORATION, Otawara (JP)

(72) Inventors: Kenzo Isogawa, Yokohama (JP); Toshiyuki Ono, Kawasaki (JP); Kenichi Shimoyama, Ota (JP); Nobuyuki Matsumoto, Inagi (JP); Shuhei Nitta, Ota (JP); Satoshi Kawata, Yokohama (JP); Toshimitsu Kaneko, Kawasaki (JP); Mai Murashima, Kawasaki (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 874 days.

(21) Appl. No.: 14/935,951

(22) Filed: Nov. 9, 2015

(65) Prior Publication Data
US 2016/0131730 A1 May 12, 2016

(30) Foreign Application Priority Data

Nov. 10, 2014 (JP) .............................. JP2014-228483
Nov. 5, 2015 (JP) .............................. JP2015-217590

(51) Int. Cl.
*G01R 33/565* (2006.01)
*G01R 33/56* (2006.01)

(52) U.S. Cl.
CPC ........ *G01R 33/565* (2013.01); *G01R 33/5608* (2013.01); *G01R 33/56545* (2013.01)

(58) Field of Classification Search
CPC ............... G01R 33/246; G01R 33/341; G01R 33/3415; G01R 33/56; G01R 33/5608;
(Continued)

(56) References Cited

U.S. PATENT DOCUMENTS 6,192,265 B1 * 2/2001 Carlsen ................ G06T 11/005
324/309
6,704,437 B1 * 3/2004 He ........................... G06T 5/20
382/128
(Continued)

FOREIGN PATENT DOCUMENTS

JP  7-23926 A  1/1995
JP  7-123373 A  5/1995
(Continued)

OTHER PUBLICATIONS

Hideaki Hisamitsu, et al., "Improvement of Image Quality for Compressed Video by Time and Spatial e-Filter Considering Local Characteristics of Image" Technical Report of IEICE, Jun. 2004, pp. 87-93 (with English language translation).
(Continued)

*Primary Examiner* — Steven L Yeninas
(74) *Attorney, Agent, or Firm* — Oblon, McClelland, Maier & Neustadt, L.L.P.

(57) ABSTRACT

A magnetic resonance imaging apparatus according to an embodiment includes an MRI system and a processing circuitry. The MRI system includes a receiving coil to receive a magnetic resonance signal. The processing circuitry is configured to generate an image based on the magnetic resonance signal, the image including a plurality of pixels; calculate a feature value corresponding to a signal value of the pixel; correct the feature values based on a sensitivity of the receiving coil; and reduce noise in the image based on distribution of the corrected feature values.

20 Claims, 8 Drawing Sheets

(58) Field of Classification Search
CPC .......... G01R 33/5611; G01R 33/56308; G01R 33/56509; A61B 5/7203; A61B 5/7207; A61B 2576/00; G06T 7/0016
USPC .......... 324/300–322; 382/128–131; 600/407–435
See application file for complete search history.

(56) References Cited

U.S. PATENT DOCUMENTS

| | | | | |
|---|---|---|---|---|
| 6,985,613 | B2* | 1/2006 | Ogino | G06T 5/20 |
| | | | | 382/131 |
| 7,061,651 | B2 | 6/2006 | Ogino | |
| 7,734,076 | B2* | 6/2010 | Du | A61B 6/032 |
| | | | | 378/16 |
| 7,978,896 | B2 | 7/2011 | Kimura | |
| 8,374,412 | B2 | 2/2013 | Kimura | |
| 8,520,927 | B2* | 8/2013 | Satoh | G06T 7/0016 |
| | | | | 382/131 |
| 8,929,675 | B2 | 1/2015 | Ono et al. | |
| 10,002,428 | B2* | 6/2018 | Hogan | G06T 5/001 |
| 2007/0126730 | A1* | 6/2007 | Goto | G06T 5/008 |
| | | | | 345/418 |
| 2007/0198203 | A1* | 8/2007 | Kimura | A61B 6/585 |
| | | | | 702/85 |
| 2008/0107316 | A1* | 5/2008 | Zhao | G01R 33/56308 |
| | | | | 382/130 |
| 2009/0190854 | A1 | 7/2009 | Zhu et al. | |
| 2010/0260402 | A1 | 10/2010 | Axelsson et al. | |
| 2012/0142095 | A1* | 6/2012 | Yano | C12M 41/14 |
| | | | | 435/366 |
| 2012/0146638 | A1* | 6/2012 | Xu | G01R 33/4838 |
| | | | | 324/309 |
| 2013/0154646 | A1* | 6/2013 | Nitta | G01R 33/246 |
| | | | | 324/318 |
| 2013/0221961 | A1* | 8/2013 | Liu | G01R 33/56545 |
| | | | | 324/307 |
| 2013/0281822 | A1* | 10/2013 | Graziani | A61B 5/055 |
| | | | | 600/410 |
| 2014/0126796 | A1* | 5/2014 | Chesneau | G01R 33/4824 |
| | | | | 382/131 |
| 2014/0212015 | A1* | 7/2014 | Ding | G06T 5/002 |
| | | | | 382/131 |
| 2014/0316248 | A1* | 10/2014 | deCharms | A61B 5/0048 |
| | | | | 600/411 |
| 2016/0113501 | A1* | 4/2016 | Hua | A61B 5/0042 |
| | | | | 600/420 |

FOREIGN PATENT DOCUMENTS

| | | |
|---|---|---|
| JP | 2002-183709 A | 6/2002 |
| JP | 2007-244848 A | 9/2007 |
| JP | 4012669 B2 | 11/2007 |
| JP | 4149126 B2 | 9/2008 |
| JP | 2009-11810 A | 1/2009 |
| JP | 2011-509697 A | 3/2011 |
| JP | 2013-46833 A | 3/2013 |
| JP | 2013-99680 A | 5/2013 |

OTHER PUBLICATIONS

Klaas P. Pruessmann, et al., "SENSE: Sensitivity Encoding for Fast MRI" Magnetic Resonance in Medicine, vol. 42, 1999, pp. 952-962.
Office Action dated Aug. 20, 2019 in corresponding Japanese Patent Application No. 2015-217590, 3 pages.

* cited by examiner

MAGNETIC RESONANCE IMAGING APPARATUS, IMAGE PROCESSING APPARATUS, AND IMAGE PROCESSING METHOD

CROSS-REFERENCE TO RELATED APPLICATIONS

This application is based upon and claims the benefit of priorities from Japanese Patent Applications No. 2014-228483, filed on Nov. 10, 2014, and No. 2015-217590, filed on Nov. 5, 2015; the entire contents of which are incorporated herein by reference.

FIELD

Embodiments described herein relate generally to a magnetic resonance imaging apparatus, an image processing apparatus, and an image processing method.

BACKGROUND

In related art, there is a known method of calculating a standard deviation of temporal change in signal intensity for each pixel of a frame, and determining an average of the calculated standard deviations of all the pixels as a magnitude of the noise, as a technique for removing noise in an image. Because an average of all the pixels is used in such a method, there are cases where it is difficult to properly remove noise in all the pixels, for example, in the case where difference in S/N (SN ratio) occurs among a plurality of pixels included in the image.

DETAILED DESCRIPTION

A magnetic resonance imaging apparatus according to an embodiment includes an MRI system and a processing circuitry. The MRI system includes a receiving coil to receive a magnetic resonance signal. The processing circuitry is configured to generate an image based on the magnetic resonance signal, the image including a plurality of pixels; calculate a feature value corresponding to a signal value of the pixel; correct the feature values based on a sensitivity of the receiving coil; and reduce noise in the image based on distribution of the corrected feature values.

The following is detailed explanation of embodiments of the MRI apparatus, the image processing apparatus, and the image processing method.

First Embodiment

Figure 1:
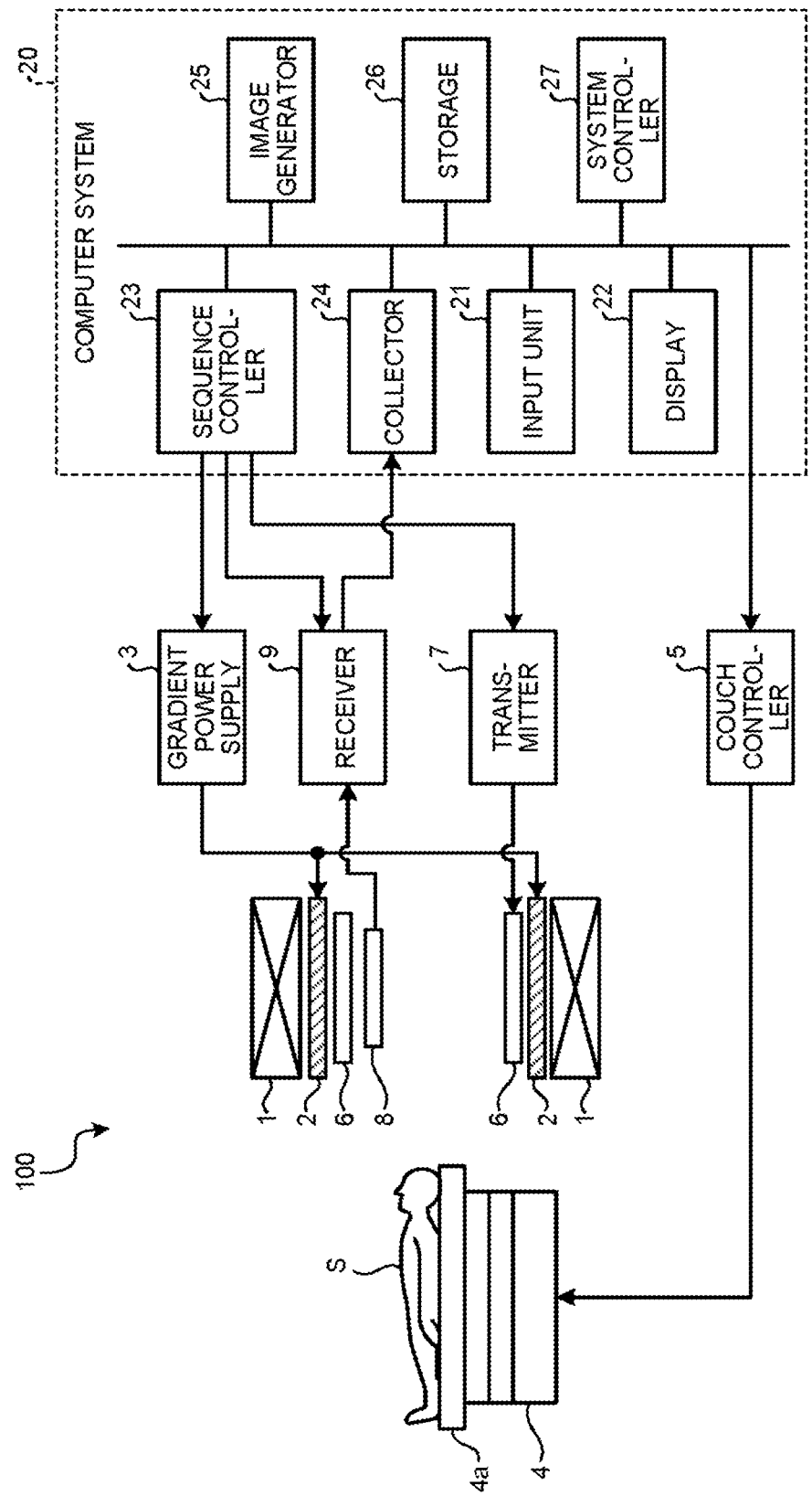
FIG. 1 is a block diagram illustrating a configuration example of an MRI apparatus according to a first embodiment.

FIG. 1 is a diagram illustrating a configuration example of an MRI apparatus according to a first embodiment. For example, as illustrated in FIG. 1, the MRI apparatus 100 includes a static magnetic field magnet 1, a gradient coil 2, a gradient power supply 3, a couch 4, a couch controller 5, a transmitting coil 6, a transmitter 7, a receiving coil 8, a receiver 9, and a computer system 20.

The static magnetic field magnet 1 is formed in a hollow and substantially cylindrical shape (including a shape having an oval cross section orthogonal to the central axis of a cylinder), and generates a uniform static magnetic field in an imaging space formed inside thereof. The static magnetic field magnet 1 is, for example, a permanent magnet, or a superconducting magnet.

The gradient coil 2 is formed in a hollow and substantially cylindrical shape (including a shape having an oval cross section orthogonal to the central axis of a cylinder), and disposed inside the static magnetic field magnet 1. Specifically, the gradient coil 2 is formed of a combination of three coils corresponding to respective axes of x, y, and z that are orthogonal to each other. The three coils generate gradient magnetic fields having magnetic field intensities changing along the respective axes of x, y, and z orthogonal to each other, in the imaging space, with electric currents that are individually supplied from the gradient power supply 3. The direction of the z axis is set to be the same as the direction of the magnetic flux of the static magnetic field.

The gradient power supply 3 supplies electric power to the gradient coil 2, to cause the gradient coil 2 to generate gradient magnetic fields. Specifically, the gradient power supply 3 individually supplies electric currents to each of the three coils included in the gradient coil 2 to cause the three coils to generate gradient magnetic fields along the respective axes of x, y, and z, as appropriate, to generate respective gradient magnetic fields along a readout direction, a phase encoding direction, and a slice direction that are orthogonal to each other, in the imaging space. In the following explanation, a gradient magnetic field along the readout direction is referred to as readout gradient magnetic field, a gradient magnetic field along the phase encoding direction is referred to as phase encoding gradient magnetic field, and a gradient magnetic field along the slice direction is referred to as slice gradient magnetic field.

These three directions are used for providing an MR signal with spatial positional information. Specifically, the readout gradient magnetic field provides a magnetic resonance (MR) signal with positional information of the readout direction, by changing a frequency of the MR signal in accordance with the position in the readout direction. The phase encoding gradient magnetic field provides an MR signal with positional information of the phase encoding direction, by changing a phase of the MR signal in accordance with the position in the phase encoding direction. The slice gradient magnetic field is used for determining the direction, the thickness, and the number of slice regions, when the imaging region is a slice region. When the imaging region is a volume region, the slice gradient magnetic field provides an MR signal with positional information along the slice direction, by changing the phase of the MR signal in accordance with the position in the slice direction.

The couch 4 includes a couchtop 4a on which a subject S is placed. The couch 4 inserts the couchtop 4a into the imaging space formed inside the static magnetic field magnet 1 and the gradient coil 2. For example, the couch 4 is installed such that a longitudinal direction of the couch 4 is parallel with the central axis of the static magnetic field magnet 1.

The couch controller 5 controls operations of the couch 4. For example, the couch controller 5 controls a driving mechanism included in the couch 4, to move the couchtop 4a in the longitudinal direction, the vertical direction, or the lateral direction.

The transmitting coil 6 is formed in a hollow and substantially cylindrical shape (including a shape having an oval cross section orthogonal to the central axis of a cylinder), and disposed inside the gradient coil 2. The transmitting coil 6 applies a radio frequency (RF) magnetic field to the imaging space, with an RF pulse current supplied from the transmitter 7.

The transmitter 7 supplies an RF pulse current corresponding to the Larmor frequency to the transmitting coil 6.

The receiving coil 8 is attached to the subject S placed in the imaging space, and receives an MR signal emitted from the subject S by the influence of the RF magnetic field applied by the transmitting coil 6. The receiving coil 8 also outputs the received MR signal to the receiver 9. For example, dedicated coils for the respective regions serving as imaging targets are used as the receiving coil 8. The dedicated coils are, for example, a receiving coil for the abdomen, a receiving coil for the head, and a receiving coil for the spine.

The receiver 9 generates MR signal data based on the MR signal received by the receiving coil 8. Specifically, the receiver 9 generates MR signal data by converting the MR signal into a digital signal, and transmits the generated MR signal data to a collector 24.

The embodiment illustrates an example of the case where the transmitting coil 6 applies an RF magnetic field and the receiving coil 8 receives an MR signal, but the embodiments are not limited thereto. For example, the transmitting coil 6 may further include a receiving function of receiving an MR signal, and the receiving coil 8 may further include a transmitting function of applying an RF magnetic field. In the case where the transmitting coil 6 includes a receiving function, the receiver 9 generates MR signal data also from the MR signal received by the transmitting coil 6. In the case where the receiving coil 8 includes a transmission function, the transmitter 7 supplies an RF pulse current also to the receiving coil 8.

The computer system 20 controls the whole MRI apparatus 100. For example, the computer system 20 includes an input unit 21, a display 22, a sequence controller 23, the collector 24, an image generator 25, a storage 26, and a system controller 27.

The input unit 21 receives inputs of various instructions and various pieces of information from an operator. For example, the input unit 21 is formed of an input device such as a keyboard, a mouse, a trackball, a touch panel, a button, and a switch.

The display 22 displays various pieces of information and various images. For example, the display 22 displays a graphical user interface (GUI) for receiving inputs of various instructions and various pieces of information from the operator. For example, the display 22 also displays an image generated by the image generator 25. For example, the display 22 is formed of a display device such as a liquid crystal monitor, a cathode-ray tube (CRT) monitor, and a touch panel.

The sequence controller 23 performs various scans. Specifically, the sequence controller 23 performs various scans by driving the gradient power supply 3, the transmitter 7, and the receiver 9 based on sequence execution data transmitted from the system controller 27. The sequence execution data is information that defines a pulse sequence indicating a process for collecting MR signal data. Specifically, the sequence execution data is information that defines the timing at which the gradient power supply 3 supplies an electric current to the gradient coil 2, the intensity of the supplied electric current, the timing at which the transmitter 7 transmits an RF pulse current to the transmitting coil 6, the intensity of the transmitted RF pulse current, and the timing at which the receiver 9 detects an MR signal.

The collector 24 collects MR signal data generated by the receiver 9, as a result of performing various scans. Specifically, when the collector 24 receives MR signal data from the receiver 9, the collector 24 performs correction, such as averaging processing and phase correction, on the received MR signal data, and transmits the corrected MR signal data to the image generator 25. The collector 24 also transmits the collected image data to the computer system 20. A set of pieces of MR signal data collected by the collector 24 are stored in the storage 26 of the computer system 20, as data that forms a k space. In the set of pieces of MR signal data, the pieces of MR signal data are arranged in a two-dimensional manner or a three-dimensional manner in accordance with the positional information provided by the readout gradient magnetic field, the phase encoding gradient magnetic field, and the slice gradient magnetic field.

The image generator 25 generates an image based on the MR signal data collected by the collector 24. Specifically, when the image generator 25 receives MR signal data from the collector 24, the image generator 25 performs post processing on the received MR signal data, that is, reconstruction such as Fourier transform, to generate an image of the subject S. The image generator 25 transmits data of the generated image to the computer system 20.

The storage 26 stores various data. For example, the storage 26 stores MR image data collected by the sequence controller 23 and data of the image generated by the image generator 25 for each subject S. The storage 26 also stores various computer programs and various data used when the sequence controller 23, the collector 24, the image generator 25, and the system controller 27 perform various pieces of processing. For example, the storage 26 is formed of a storage device such as a random access memory (RAM), a read only memory (ROM), a flash memory, a hard disk, and an optical disk.

The system controller 27 controls the elements included in the MRI apparatus 100, to control the whole MRI apparatus 100. For example, the system controller 27 receives inputs of various imaging parameters from the operator via the input unit 21. The system controller 27 generates sequence execution data based on the received imaging parameters, and transmits the generated sequence execution data to the sequence controller 23, to perform various scans.

As a result of performing various scans, the system controller 27 stores the MR signal data transmitted from the collector 24 and the data of the image transmitted from the image generator 25 in the storage 26. The system controller 27 reads out an image required by the operator from the storage 26, and outputs the read image to the display 22. In addition, for example, the system controller 27 operates the couch 4, by controlling the couch controller 5 based on an instruction received from the operator via the input unit 21.

Among the elements described above, the sequence controller 23, the collector 24, the image generator 25, and the system controller 27 include, for example, processors such as central processing units (CPU) and micro processing units (MPU), memories, or electronic circuits such as application specific integrated circuits (ASIC) and field programmable gate arrays (FPGA). In such a case, for example, the respective processors included in the sequence controller 23, the collector 24, the image generator 25, and the system controller 27 read out from the storage 26 and perform computer programs that define the processing procedures of the processing to be performed by the respective elements, to perform the processing in accordance with the processing procedures.

The present embodiment illustrates an example of the case where each of the sequence controller 23, the collector 24, the image generator 25, and the system controller 27 includes a processor, but the embodiments are not limited thereto. The structures of the sequence controller 23, the collector 24, the image generator 25, and the system controller 27 may be distributed or integrated as appropriate. For example, the MRI apparatus 100 may include a processor, and the processor may perform the processing to be performed by the sequence controller 23, the collector 24, the image generator 25, and the system controller 27. In addition, for example, the MRI apparatus 100 may include a plurality of processors, and the processors may perform the processing to be performed by the sequence controller 23, the collector 24, the image generator 25, and the system controller 27, as appropriate in a distributed manner.

The configuration example of the MRI apparatus 100 according to the first embodiment has been explained above. With the structure described above, the MRI apparatus 100 calculates a feature value related to a signal value of the pixel for each of a plurality of pixels included in an image, corrects feature vectors of the respective pixels based on a sensitivity of a receiving coil that receives an MR signal, and reduces noise in the image based on distribution of the corrected feature vectors.

According to the first embodiment, the MRI apparatus 100 calculates a feature vector related to a signal value of the pixel for each of a plurality of pixels included in an image, and calculates a correction map based on information on distribution of noise generated in the pixels according to the imaging conditions. Thereafter, the MRI apparatus 100 corrects feature vectors of the respective pixels using the calculated correction map, and reduces noise in the image based on distribution of the corrected feature vectors.

In the present embodiment, the feature value is indicated by a feature vector including a plurality of elements. However, the embodiments are not limited thereto. For example, the feature value may be indicated by scalar.

For example, there is a method using a noise removal apparatus including adjustment parameters according to the noise quantity of the input image as a technique for removing noise in an image. This method requires providing the noise removal apparatus with a noise quantity from outside. In addition, for example, there is a method of calculating a standard deviation of temporal change of the signal intensity for each of pixels of the frame, and determining an average of the calculated standard deviations of all the pixels as a magnitude of noise. This method does not require a noise quantity provided from outside. However, because this technique uses an average of all the pixels, it may be difficult to properly remove noise in all the pixels, for example, in the case where difference in S/N exists among a plurality of pixels included in the image, although the technique has no problem when the noise quantity of the input image is uniform in the image.

Generally, MRI apparatuses are known to have an S/N that is non-uniform among pixels, in the case of performing imaging with a plurality of small receiving coils attached to the surface of the subject. For example, the S/N is high on the surface of the body close to the receiving coils, and the S/N is low in the vicinity of the center of the body that is distant from the receiving coils. In such a case, the above techniques cannot cope with the difference in S/N among pixels, and there are cases where noise in a pixel having a noise quantity larger than an estimated noise quantity cannot be entirely removed, or a feature of the signal of a pixel having a noise quantity smaller than the estimated noise quantity is lost.

By contrast, the MRI apparatus 100 according to the first embodiment corrects the difference in S/N among pixels using information on distribution of noise generated in the pixels according to the imaging conditions. With this structure, the MRI apparatus 100 can properly remove noise in all the pixels even when the difference in S/N occurs among a plurality of pixels included in the image. This structure suppresses loss of a feature of a signal in the image due to noise removal. More specifically, the MRI apparatus 100 according to the first embodiment enables noise removal with which noise is properly removed from all the pixels and features of signals are hardly lost, through enhanced accuracy of estimation of noise quantity enhanced by estimating a noise quantity using a feature vector that reflects the imaging conditions as well as enhanced performance of the denoising processor.

Figure 2:
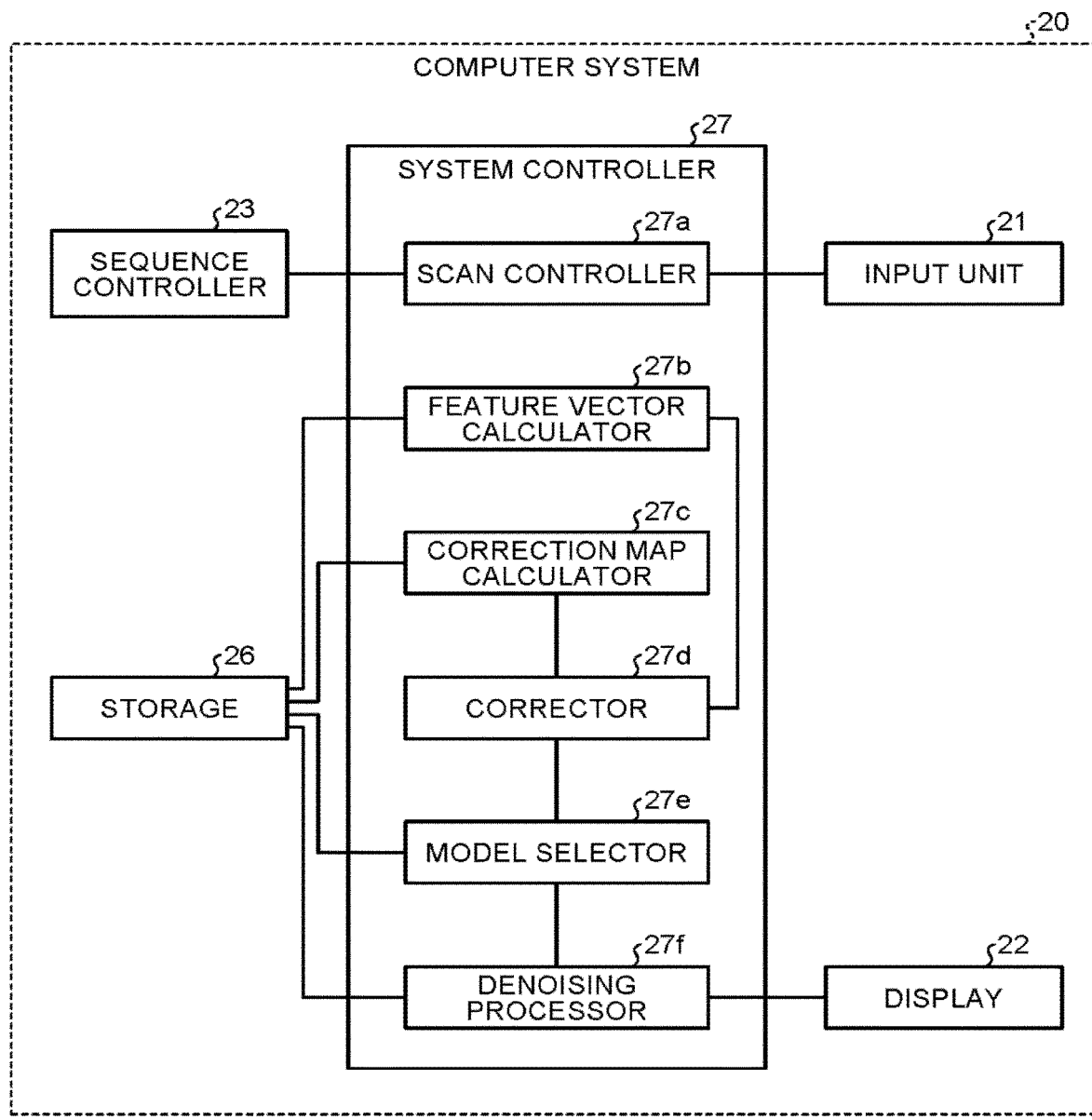
FIG. 2 is a block diagram illustrating a configuration example of functions included in the MRI apparatus according to the first embodiment.

FIG. 2 is a block diagram illustrating a configuration example of functions included in the MRI apparatus 100 according to the first embodiment. FIG. 2 illustrates the input unit 21, the display 22, the sequence controller 23, the storage 26, and the system controller 27, among the constituent elements included in the computer system 20 illustrated in FIG. 1. For example, as illustrated in FIG. 2, the system controller 27 includes a scan controller 27a, a feature vector calculator 27b, a correction map calculator 27c, a corrector 27d, a model selector 27e, and a denoising processor 27f.

The scan controller 27a receives inputs of various imaging parameters from the operator via the input unit 21. For example, the system controller 27 displays the GUI for receiving inputs of the various imaging parameters on the display 22, and receives inputs of the various imaging parameters via the displayed GUI. The scan controller 27a generates sequence execution data based on the received imaging parameters, and transmits the generated sequence execution data to the sequence controller 23, to perform various scans.

The feature vector calculator 27b calculates a feature vector related to a signal value of each of a plurality of pixels included in the image generated based on the MR signal generated from the subject S. The correction map calculator 27c calculates a correction map based on information on distribution of noise generated in the pixels according to the imaging conditions. The corrector 27d corrects the feature vectors of the respective pixels included in the image using the correction map generated by the correction map calculator 27c.

The denoising processor 27f reduces noise in the image based on distribution of the feature vectors corrected by the corrector 27d. In the present embodiment, as an example, the model selector 27e selects a noise model from a plurality of noise models based on the distribution of the feature vectors corrected by the corrector 27d. In the present embodiment, the denoising processor 27f reduces noise in the image using the noise model selected by the model selector 27e.

Figure 3:
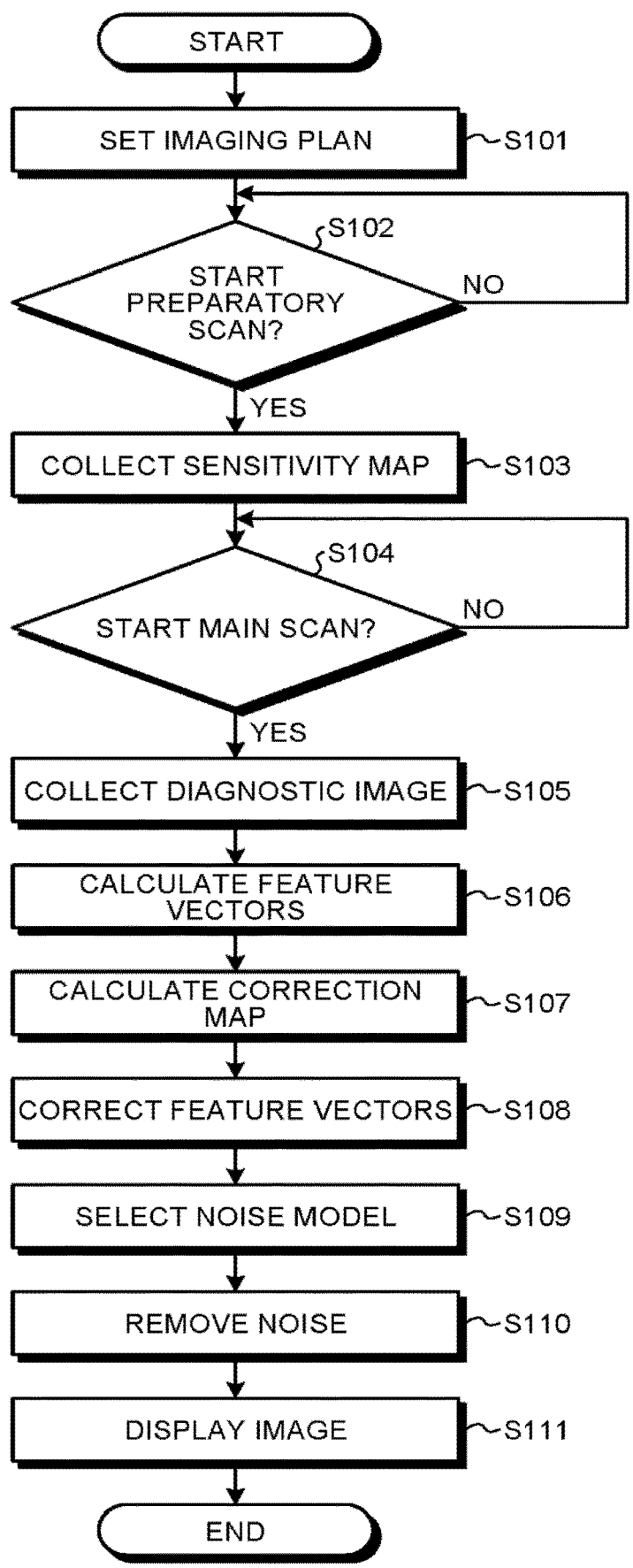
FIG. 3 is a flowchart illustrating processing procedures of an image processing method performed by the MRI apparatus according to the first embodiment.

FIG. 3 is a flowchart illustrating processing procedures of an image processing method performed by the MRI apparatus 100 according to the first embodiment. The present embodiment illustrates an example of the case where the MRI apparatus 100 calculates a correction map based on information on distribution of noise generated in the pixels according to the sensitivity of the receiving coil that receives a magnetic resonance signal. Specifically, the present embodiment illustrates an example of the case where the imaging condition described above is a sensitivity of the receiving coil that receives a magnetic resonance signal.

Specifically, in the present embodiment, the MRI apparatus 100 photographs an image by high-speed imaging in which imaging is performed with a plurality of receiving coils using difference in sensitivity among the receiving coils, like SENSE disclosed in Non-Patent Document 2. In the imaging, a sensitivity map that indicates distribution of sensitivities of the receiving coils is collected in a preparatory scan that is performed before a main scan that is mainly performed to collect a diagnostic image.

For example, as illustrated in FIG. 3, first, the scan controller 27a receives setting of an imaging plan from the operator (Step S101).

For example, the scan controller 27a holds in advance information on a pulse sequence including initial set values of imaging parameters such as repetition time (TR) and echo time (TE). For example, the scan controller 27a manages pulse sequence groups each including a pulse sequence for preparatory scans and a pulse sequence for main scans for each of the imaging regions and imaging purposes. The scan controller 27a presents the pulse sequence groups to the operator for the respective imaging regions and imaging purposes via the GUI, and receives selection and change of the pulse sequence group from the operator, to receive an inspection pulse sequence group executed in the inspection of the target and settings of the imaging parameters.

Thereafter, when the scan controller 27a receives an instruction to start a preparatory scan from the operator (Yes at Step S102), the scan controller 27a starts execution of the preparatory scan based on the imaging plan that is set by the operator.

In the present embodiment, the scan controller 27a performs a scan to collect a sensitivity map, as a preparatory scan (Step S103). Thereafter, the collector 24 collects MR signal data obtained by the scan, and the image generator 25 generates a sensitivity map based on the collected MR signal data. The preparatory scan may include a scan for shimming, for example, and a scan for collecting a positioning image to perform positioning of a diagnostic image.

Thereafter, when the scan controller 27a receives an instruction to start a main scan from the operator (Yes at Step S104), the scan controller 27a starts a main scan based on the imaging plan that is set by the operator.

Specifically, the scan controller 27a performs a scan to collect a diagnostic image as a main scan (Step S105). Thereafter, the collector 24 collects MR signal data obtained by the scan, and the image generator 25 generates a diagnostic image based on the collected MR signal data and the sensitivity map.

For example, the scan controller 27a performs a plurality of scans to collect a plurality of types of diagnostic images in the main scan. For example, in the case where the target region of the inspection is the heart, the scan controller 27a performs a scan to collect a left ventricular short axis view, a scan to collect a left ventricular two-chamber long axis view, a scan to collect a left ventricular three-chamber long axis view, and a scan to collect a left ventricular four-chamber long axis view, in inspection of the cardiac function of the left ventricular system of the heart. The scan controller 27a also performs a scan to collect a right ventricular short axis view, a scan to collect a right ventricular two-chamber long axis view, a scan to collect a right ventricular three-chamber long axis view, and a scan to collect a right ventricular four-chamber long axis view, in inspection of the cardiac function of the right ventricular system of the heart.

Thereafter, the feature vector calculator 27b calculates feature vectors for the respective pixels included in the image generated by the image generator 25 (Step S106). This explanation illustrates an example in the case where the feature vector calculator 27b uses a two-dimensional still image as an input image.

Specifically, the feature vector calculator 27b calculates a fluctuation quantity of a signal value of the pixel, for each of the pixels included in the image, based on the signal value of the pixel and signal values of other pixels located in positions spatially close to the pixel, as an element of the feature vector.

For example, a feature vector v (x, y) includes a representative signal value $v_0$ (x, y) serving as a signal value that represents coordinates (x, y), and a fluctuation quantity $v_1$ (x, y) of the signal value in the coordinates (x, y). For example, suppose that $v_0$ (x, y) is an average of the signal values, and $v_1$ (x, y) is a standard deviation of the signal value.

In such a case, for example, where (x, y) is coordinates indicating each pixel included in the image; R is a neighborhood of (x, y) that is set by the operator in advance; N is the number of pixels included in R; and s (x, y) is a signal value, the feature vector v (x, y)=($v_0$ (x, y), $v_1$ (x, y)) is expressed by Expression (1) as follows.

$$\begin{pmatrix} v_0(x, y) \\ v_1(x, y) \end{pmatrix} = \begin{pmatrix} \dfrac{\sum_{(x', y') \in R} s(x', y')}{N} \\ \sqrt{\dfrac{\sum_{(x', y') \in R} (s(x', y')^2)}{N} - v_0(x, y)^2} \end{pmatrix} \quad (1)$$

The neighborhood R is preferably set to include pixels corresponding to the same body tissue therein as much as possible.

Figure 4:
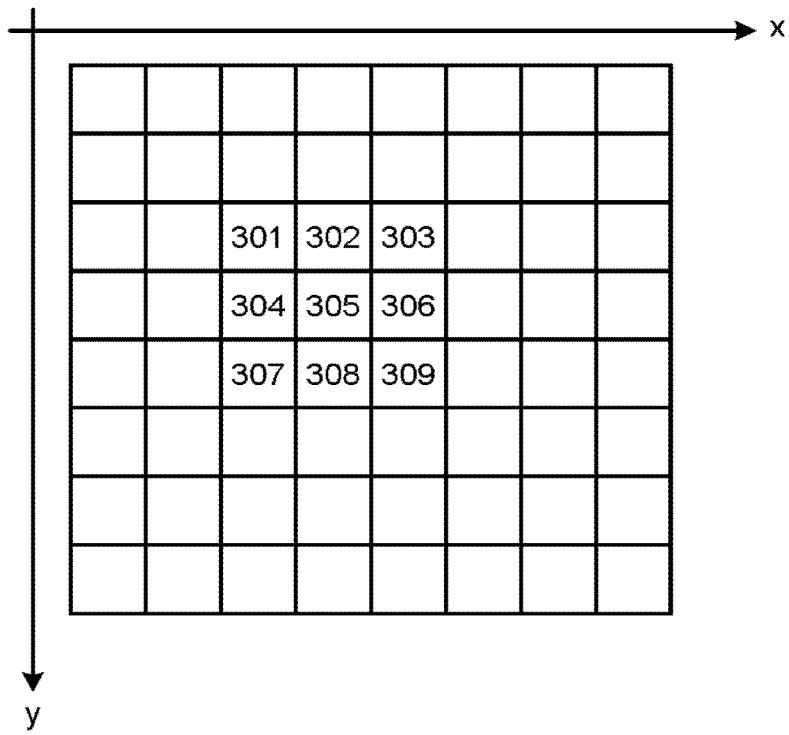
FIG. 4 is a diagram illustrating an example of a neighborhood R used by a feature vector calculator according to the first embodiment.

FIG. 4 is a diagram illustrating an example of the neighborhood R used by the feature vector calculator 27b according to the first embodiment. For example, as illustrated in FIG. 4, when noise is removed from the pixel 305, the feature vector calculator 27b sets a block of 3×3 including (x, y) as the center, like pixels 301 to 309 located around the pixel 305, as the neighborhood R. In this case, N is 9.

If the block used as the neighborhood R is extended excessively, for example, there can be cases where the feature vector is calculated from a signal string acquired across two types of organs, and thus the accuracy of noise quantity estimation performed at the subsequent stage may decrease. By contrast, if the block is narrowed down excessively, the accuracy of $v_0$ (x, y) and the accuracy of $v_1$ (x, y)

may decrease, and thus the accuracy of the noise quantity estimation performed at the subsequent stage may decrease. To prevent such problems, the operator of the MRI apparatus 100 selects the neighborhood R using the information of the subject, for example.

With reference to FIG. 3 again, thereafter, the correction map calculator 27c calculates a correction map to correct the feature vector v (x, y) based on the sensitivity map generated by the image generator 25 (Step S107).

For example, suppose that the value of the coordinates in the correction map is M (x, y). For example, M (x, y) is a positive real number, and has a large value when the S/N in the coordinates (x, y) is high. The value of M (x, y) is set using the value that indicates the sensitivity of the receiving coil at each point of the sensitivity map. The value of each point in the sensitivity map has higher sensitivity as the point is closer to the receiving coil. Specifically, the correction map has a larger value in a position with higher sensitivity of the receiving coil.

Thereafter, the corrector 27d corrects the feature vector v (x, y) calculated by the feature vector calculator 27b using the correction map M (x, y) calculated by the correction map calculator 27c (Step S108). In the following explanation, a corrected feature vector is referred to as corrected feature vector v' (x, y).

For example, the corrector 27d performs correction on at least one element in the feature vector of each of a plurality of pixels included in the image such that the element corresponding to a position having a smaller value in the correction map M (x, y) has a smaller value, and the element corresponding to a position having a larger value in the correction map M (x, y) has a larger value. This correction unifies the conditions for observation of the fluctuation quantities of the signal values obtained from pixels having different S/N ratios.

For example, the corrected feature vector v' (x, y) is expressed by Expression (2) as follows, when the corrected $v_0$ (x, y) is $v_0'$ (x, y) and the corrected $v_1$ (x, y) is $v_1'$ (x, y).

$$v'(x, y) = \begin{pmatrix} v_0'(x, y) \\ v_1'(x, y) \end{pmatrix} = M(x, y)\begin{pmatrix} v_0(x, y) \\ v_1(x, y) \end{pmatrix} \quad (2)$$

Thereafter, the model selector 27e selects a noise model from a plurality of noise models stored in the storage 26 in advance using the corrected feature vectors v' (x, y) (Step S109).

For example, the model selector 27e selects a noise model that most approximates to the data point group indicated by the corrected feature vectors v' (x, y). For example, the noise model described herein outputs a noise quantity in response to an input signal value. The noise model outputs a smaller noise quantity as the input signal value is smaller, and outputs a larger noise quantity as the input signal value is larger. In addition, the output noise quantity of the noise model converges to a fixed value as the input signal value increases.

Figure 5:
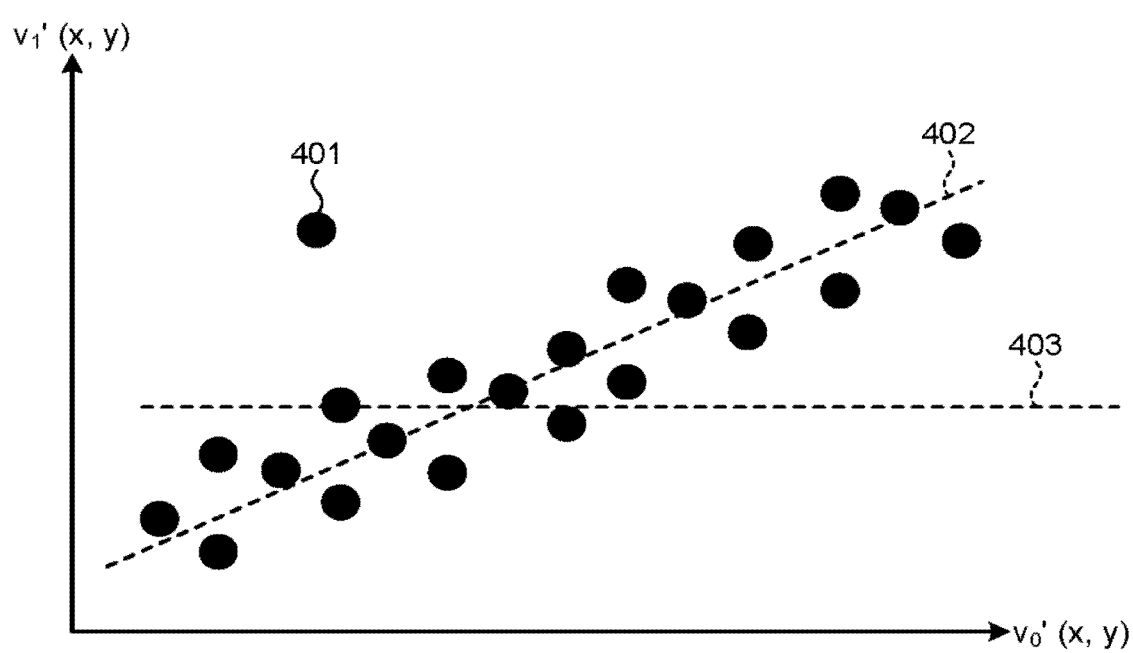
FIG. 5 is a diagram illustrating an example of noise model selection performed by a model selector according to the first embodiment.

FIG. 5 is a diagram illustrating an example of noise model selection performed by the model selector 27e according to the first embodiment. FIG. 5 illustrates distribution of the corrected feature vectors v' (x, y) obtained by the corrector 27d. In FIG. 5, the horizontal axis indicates $v_0'$ (x, y) and the vertical axis indicates $v_1'$ (x, y).

For example, as illustrated in FIG. 5, suppose that a data point 401 indicated by the corrected feature vector v' (x, y) is obtained. The data point 401 corresponds to a corrected feature vector v' (x, y).

For example, the storage 26 stores a plurality of noise models, each of which outputs a value a corresponding to the noise level, when a value s corresponding to a signal level is input. For example, the noise model is expressed by Expression (3) as follows.

$$\sigma = f_{402}(s) = a_{402}s + b_{402} \quad (3)$$

The noise model is indicated by a straight line such as a broken line 402 and a broken line 403 illustrated in FIG. 5, for example. For example, the model selector 27e selects a noise model that runs closest to a data point group formed of a plurality of corrected feature vectors, from a plurality of straight-line noise models stored in the storage 26. For example, when the storage 26 stores both of the noise model indicated by the broken line 402 and the noise model indicated by the broken line 403 illustrated in FIG. 5, the model selector 27e selects the noise model indicated by the broken line 402. This structure enables prediction of a noise quantity based on the S/N serving as the standard from the signal value.

As a specific method, for example, the model selector 27e may perform the Hough transform using the data point group illustrated in FIG. 5 as input. The model selector 27e may select a noise model having a minimum sum total of the absolute values of differences between estimated values σ of noise quantities estimated by using the representative signal values $v_0'$ (x, y) in the respective coordinates and the fluctuation quantities $v_1'$ (x, y) of the actually observed signal values. Specifically, the model selector 27e selects a noise model F (s) expressed by Expression (4) as follows, when a plurality of noise models stored in the storage 26 are Fi (s).

$$F(s) = \underset{i}{\mathrm{argmin}}\left(\sum_{x,y} |v_1'(x, y) - F_i(v_0'(x, y))|\right) \quad (4)$$

With reference to FIG. 3 again, thereafter, the denoising processor 27f estimates noise quantities of the respective pixels included in the image using the noise model F (s) selected by the model selector 27e, and removes noise based on the obtained noise quantities (Step S110).

In the processing, for example, the denoising processor 27f increases the intensity of noise removal, as the noise quantities output from the noise model selected by the model selector 27e increases.

Specifically, first, the denoising processor 27f obtains F (s (x, y)) using the signal value s (x, y) before noise removal. Thereafter, using the correction map M (x, y), the denoising processor 27f performs correction reverse to the correction performed by the corrector 27d on the $v_1$ (x, y), to obtain an estimated value σ (x, y) of the noise quantity in the coordinates (x, y).

Thereafter, the denoising processor 27f increases the intensity of the denoising processing for determining an output in the coordinates (x, y) as the estimated value σ (x, y) of the noise quantity increases, to obtain a signal value s' (x, y).

The method for increasing the intensity of the denoising processing depends on the noise removal method adopted by the denoising processor 27f. For example, as disclosed in Non-patent Document 1, the threshold may be set larger in the case of performing processing using a weighted average of signals only when difference of each of the signals from s (x, y) does not exceed the threshold. In the case of using filtering, the tap width of the filter may be increased, or a coefficient designed to further prevent high frequency from passing may be adopted.

Thereafter, the denoising processor 27f displays a noise-removed image on the display 22 (Step S111). The denoising processor 27f may store a noise-removed image in the storage 26.

The processing procedure described above illustrates an example in the case where scan to collect a sensitivity map is performed as preparatory scan, but the embodiments are not limited thereto. For example, scan to collect a sensitivity map may be performed during the main scan. In addition, a sensitivity map collected in another inspection on the same subject may be used.

As described above, the MRI apparatus 100 according to the first embodiment corrects signal values of the respective pixels using information on distribution of noise generated in the pixels according to the sensitivity distribution of the receiving coil 8. Accordingly, the MRI apparatus 100 according to the first embodiment can properly remove noise in all the pixels, even in the case where differences in S/N occur among a plurality of pixels included in the image due to non-uniform sensitivity of the receiving coil 8. This structure suppresses loss of features of signals in the image due to noise removal.

The present embodiment illustrates an example in the case of calculating a correction map based on information on distribution of noise generated in the pixels according to the sensitivity of the receiving coil, but the imaging conditions are not limited to the sensitivity of the receiving coil. For example, when differences in S/N occur among pixels due to another imaging condition, a correction map may be calculated based on information on noise distribution in accordance with the imaging condition.

In addition, the above embodiment may be modified to be carried out as in the following modification explained hereinafter.

First Modification

For example, the first embodiment described above illustrates an example in the case where the feature vector calculator 27b uses a two-dimensional still image as an input image, but the dimensions of the input image are not always limited to two dimensions. For example, the input image may be three-dimensional volume data. Specifically, the dimensions of the input image may be increased, such as using a signal value s (x, y, z) of the input image and a correction map M (x, y, z). In addition, as another example, when a two-dimensional moving image is input, s (x, y, z) and a correction map M (x, y) should be handled. In the case of inputting three-dimensional time-series data, a signal value s (x, y, z, t) of the input image and a correction map M (x, y, z) should be handled.

Second Modification

In addition, for example, the shape of the neighborhood R used by the feature vector calculator 27b may be changed as desired according to the information at the time of imaging. For example, when the scan controller 27a receives setting of the imaging plan from the operator, the scan controller 27a further receives setting of the neighborhood R. The feature vector calculator 27b calculates a feature vector using the neighborhood R received by the scan controller 27a.

For example, when the MRI apparatus photographs a moving image of the heart, the subject can be regarded as hardly moving, because the doctor instructs the subject (patient) not to move. In the case where the subject can be regarded as hardly moving and the input image is a two-dimensional moving image, for example, the feature vector calculator 27b may calculate a fluctuation quantity of a signal value of the pixel, as an element of the feature vector, for each of a plurality of pixels included in the image, based on the signal value of the pixel and signal values of other pixels located in positions temporally close to the pixel.

Figure 6:
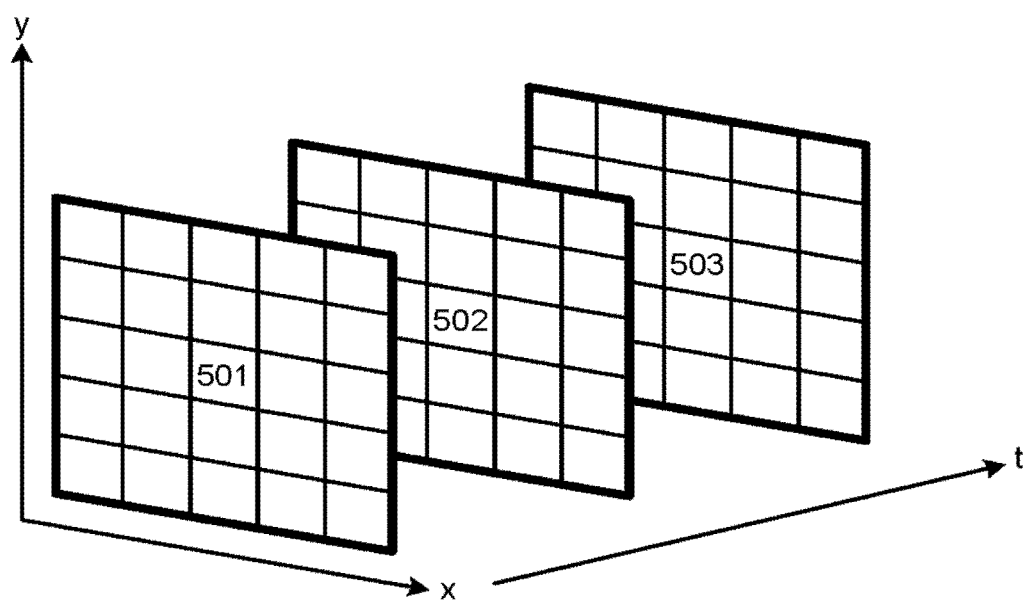
FIG. 6 is a diagram illustrating a setting example of a neighborhood R according to a second modification.

FIG. 6 is a diagram illustrating a setting example of the neighborhood R according to the second modification. For example, as illustrated in FIG. 6, when a plurality of two-dimensional frames imaged at different times t are input as the input image, the feature vector calculator 27b may set a range of pixels 501 to 503 located in the same position (x, y) in the respective frames, as the neighborhood R. Specifically, the feature vector calculator 27b may set the neighborhood R along the time direction.

In addition, for example, when the same body tissue can be regarded as continuing in the direction of the backbone in three-dimensional volume data obtained by imaging the lumbar vertebra and the like, a range of a plurality of pixels that are disposed along the direction of the backbone may be set as the neighborhood R. Specifically, the feature vector calculator 27b may set the neighborhood R along the shape of the region to be imaged.

For example, as described above, in order to support the setting of an imaging plan from the operator, when pulse sequence groups each including a pulse sequence for preparatory scans and a pulse sequence for main scans are managed for the respective imaging regions and imaging purposes, the neighborhood R may be set and managed according to the imaging region and the imaging purpose. In such a case, the neighborhood R may be changeable via the GUI, or may be unchangeable without being displayed on the GUI.

For example, when the target region of the inspection is a region with a shape that widely changes with lapse of time such as the heart, the standard deviation of the signal value may be prominently large for pixels of the portion with much movement. However, generally, because the area where the MR signals are collected is often set larger than the target region in consideration of aliasing artifact and the like, signals in portions with little movement are dominant in the whole collected MR signals. With respect to this point, in the noise removal method described above, because a noise model that most approximates to the feature vector data group, a noise model is selected based on feature vectors of pixels in the portion with little movement as a result, even when a signal value having a prominently large standard deviation exists. For this reason, the noise quantity is estimated also for pixels of the portion with much movement, based on another portion with little movement. Accordingly, the above method removes noise from the image without losing the feature of anatomical movement of the target region, even when the inspection target region is a region with a shape that widely changes with lapse of time such as the heart.

Third Modification

In addition, for example, the feature vector calculator 27b does not necessarily calculate feature vectors for all the pixels included in the image. For example, the feature vector calculator 27b may calculate feature vectors only for pixels having x and y, both of which are even numbers. As another example, when pixels that represent no body tissues are recognized in advance, the feature vector calculator 27b may perform no calculation from the pixels. Specifically, the feature vector calculator 27b may thin out pixels, to calculate feature vectors. This structure reduces the calculation cost.

When the calculated value of the fluctuation quantity $v_1$ (x, y) of the signal value is extremely large, the neighborhood R used for calculation of dispersion may include the boundary of the body tissue. For this reason, for example, the corrector 27d may use a threshold that is set by the operator in advance, to prevent use of the feature vectors calculated by the feature vector calculator 27b for such pixels.

Fourth Modification

In addition, for example, among the elements of the feature vector, a median or a mode of the signal value may be used for $v_0$ (x, y), and dispersion or difference between the signal maximum value and the minimum value may be used for $v_1$ (x, y). For example, Rice distribution that is known as a noise model of an image photographed by an MRI apparatus is known as becoming close to Gaussian distribution when the signal level is high, and using the average and the standard deviation should be theoretically compatible.

Fifth Modification

In addition, for example, the elements of the feature vector are not necessarily limited to the following two elements: the signal value that represents the coordinates and the fluctuation quantity in the coordinates. For example, the feature vector calculator 27b may include the value of the sensitivity map used for calculation of a correction map in the elements of the feature vector.

Besides, for example, the feature vector calculator 27b may include a geometry factor indicating accuracy of calculation of a signal value in image reconstruction in the elements of the feature vector, when the input image is obtained by high-speed imaging in which a plurality of receiving coils are used and imaging is performed using difference in sensitivity among the receiving coils, such as SENSE disclosed in Non-patent Document 2.

When such expansion is performed, the noise model F (s) includes additional terms of l that indicates a value of the sensitivity map, and g that indicates a geometry factor, as expressed in Expression (5) as follows. In Expression (5), a, b, c, and d are real numbers.

$$F(s,l,g)=as+b+cl+dg \quad (5)$$

Sixth Modification

In addition, for example, the correction map M (x, y) may be calculated so as to have a larger value at a position with lower accuracy of calculation of a signal value in image reconstruction when the input image is obtained by high-speed imaging in which a plurality of receiving coils are used and imaging is performed using difference in sensitivity among the receiving coils. Non-patent Document 2 discloses that the S/N is a reciprocal number of the geometry factor. The geometry factor does not affect the signal level of the image, unlike the sensitivity of the receiving coil. For this reason, for example, Expression (2) used for the feature vector may be changed such that the representative signal value $v_0$ (x, y) serving as a signal value that represents the coordinates is not corrected, as expressed in Expression (6) as follows.

$$\begin{pmatrix} v'_0(x, y) \\ v'_1(x, y) \end{pmatrix} = \begin{pmatrix} v_0(x, y) \\ M(x, y)v_1(x, y) \end{pmatrix} \quad (6)$$

The corrector 27d may correct feature values of the respective pixels, further based on the geometry factor used in high-speed imaging. In such a case, for example, the correction map calculator 27c changes the value of the correction map M (x, y) to a value obtained by using two values, such as a value obtained by dividing the value of the sensitivity map of the receiving coil by the geometry factor, and a value obtained by subtracting the geometry factor from the value of the sensitivity map of the receiving coil. In addition, the correction map is not necessarily limited to one, but two correction maps may be used together. For example, a correction map $M_0$ (x, y) resulting from data that affects the signal level, and a correction map $M_1$ (x, y) resulting from data that does not affect the signal level may be prepared to correct the feature vectors as expressed in Expression (7) as follows.

$$\begin{pmatrix} v'_0(x, y) \\ v'_1(x, y) \end{pmatrix} = M_0(x, y) \begin{pmatrix} v_0(x, y) \\ M_1(x, y)v_1(x, y) \end{pmatrix} \quad (7)$$

Seventh Modification

In addition, for example, the noise model F (s) is not necessarily limited to the straight-line shape as expressed in Expression (3). For example, the noise model F (s) may be expressed by a special function such as log (s) and $s^{1/2}$, and a segmental polygonal line.

Eighth Modification

In addition, for example, the noise model F (s) does not necessarily include a term corresponding to the signal value as expressed in Expression (3). For example, such a noise model is expressed as a horizontal line like the broken line 403, in the example illustrated in FIG. 5. For example, Rice distribution that is known as a noise model of an image photographed by an MRI apparatus is known as becoming close to Gaussian distribution when the signal level is high, but the standard deviation of Gaussian distribution does not depend on the signal level. In the case of using such a model, the input image may be binarized with a signal value, and only a bright portion may be used for feature vector calculation. Although this method should achieve high speed processing because the method reduces the calculation quantity of the model selector 27e, the method has a risk of reduction in noise removal performance in the dark portion.

Ninth Modification

In addition, for example, the denoising processor 27f may change the noise removal method according to the characteristic of the target subject. For example, as described above, when a moving image of the heart is photographed by an MRI apparatus, the subject can be regarded as hardly moving, because the doctor instructs the subject (patient) not to move. In such a case, the denoising processor 27f may remove noise using filtering in the time direction as disclosed in Non-patent Document 1.

In addition, for example, the denoising processor 27f may change the noise removal method according to the imaging conditions. The imaging conditions described herein include, for example, the imaging region and the imaging method. For example, the denoising processor 27f performs noise removal using filtering in the time direction, when the imaging region is the heart. For example, the denoising processor 27f performs noise removal using filtering in the spatial direction when an imaging method using a contrast medium is performed.

Tenth Modification

Sixth modification illustrates an example in the case where the feature value is corrected further based on the geometry factor used in high-speed imaging, but the embodiments are not limited thereto. For example, according to the type of high-speed imaging, there are cases where the sensitivity of the image is corrected in the process of reconstructing the image, without sensitivity correction using a sensitivity map. In the case of using such high-speed imaging, the corrector 27d may correct the feature value based on the geometry factor, without using a sensitivity map. In such a case, for example, the correction map calculator 27c calculates a correction map based on the geometry factor without using a sensitivity map.

In inspection of the heart, there are the cases of performing a scan to collect a cine image (moving image) of the heart or a scan to collect volume data of the heart, as a main scan, in one inspection, in addition to the scan to collect cross-sectional images such as a short axis view and a long axis view. In such a case, the MRI apparatus 100 may switch the noise removal method according to the type of images collected in the respective scans. Specifically, the MRI apparatus 100 removes noise in a cross-sectional image by the method using a two-dimensional still image as the input image as explained in the first embodiment, removes noise in a cine image by the method using a moving image as the input image as explained in the first modification, and removes noise in volume data by the method using volume data as the input as explained in the first modification.

Eleventh Modification

In addition, for example, when the input image is a moving image, noise removal methods may be different between a region including large movement of the subject (a motion region) and a region including small movement of the subject (a static region).

In this case, the image generator 25 generates a moving image based on MR signal data. The denoising processor 27f detects a motion region and a static region from the moving image generated by the image generator 25, and reduces noise by different methods for each of the regions. The static region referred to herein indicates a region including movement smaller than that of the motion region, and is not always limited to a completely static region.

For example, the denoising processor 27f detects each pixel having a larger temporal fluctuation quantity of a signal value of the pixel in the same position in a plurality of frames included in the moving image than a threshold based on a noise quantity obtained from the noise model, as a pixel of the motion region. The denoising processor 27f also detects each pixel having a smaller or equal temporal fluctuation quantity of a signal value of the pixel in the same position in a plurality of frames included in the moving image than or to the threshold based on the noise quantity obtained from the noise model, as a pixel of the static region.

Figure 7:
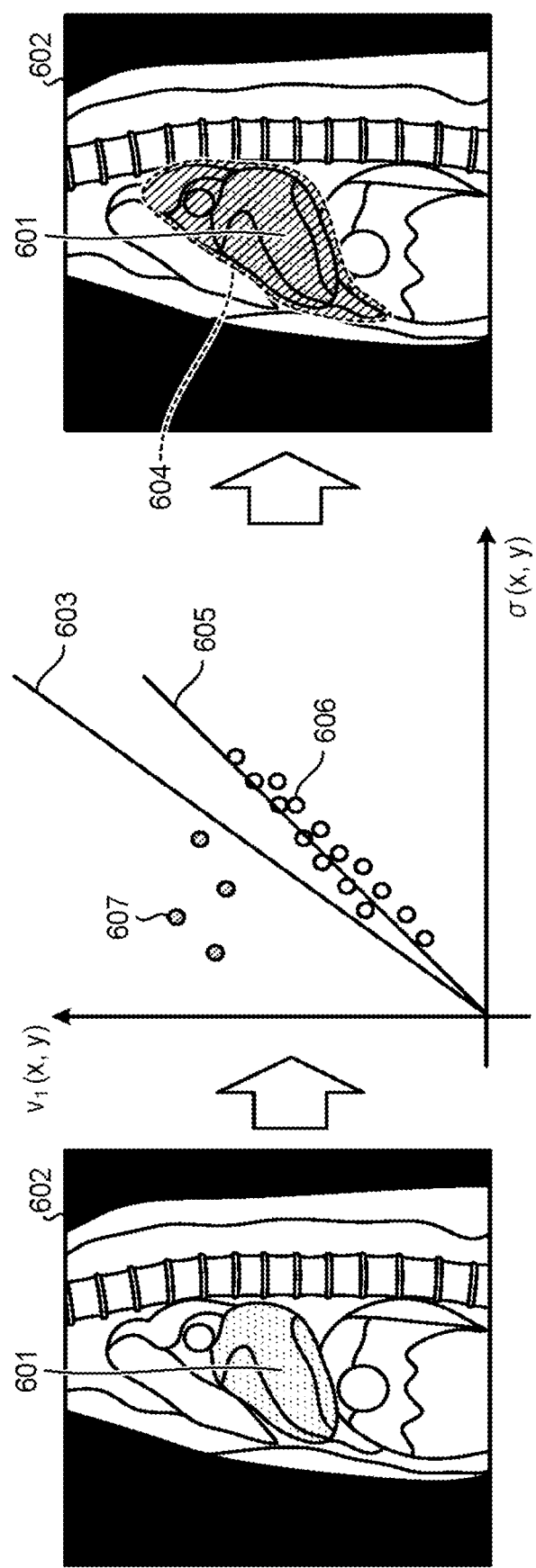
FIG. 7 is a diagram illustrating an example of noise removal according to an eleventh modification.

FIG. 7 is a diagram illustrating an example of noise removal according to the eleventh modification. For example, the figure shown on the left side of FIG. 7 illustrates a moving image 602 including a heart 601.

In the middle of FIG. 7, the horizontal axis indicates a value $\sigma$ (x, y) of the noise quantity of each pixels, estimated by the above explained method, and the vertical axis indicates a temporal fluctuation quantity $v_1$ (x, y) of a signal value. Every pixels in input image has one point in the middle of FIG. 7 related to its $\sigma$ (x, y) and $v_1$ (x, y). It's expected that a pixel in static region provides a point on a line 605 in the middle of FIG. 7 whose slope is 1.0, because a difference between $\sigma$ (x, y) and $v_1$ (x, y) becomes smaller. And it's also expected that a pixel in moving region provides a point above line 605 (for example point 607) because the $v_1$ (x, y) is affected by motion of the heart 601.

The denoising processor 27f determines whether a pixel (x, y) belongs to the moving region or the static region by comparing the $v_1$ (x, y) and the noise quantity $\sigma$ (x, y) obtained from the noise model. For example, as illustrated on the middle of FIG. 7, a threshold 603 (for example a line whose slope is larger than 1.0) with respect to $v_1$ (x, y) is set according to a noise quantity $\sigma$ (x, y) obtained from the noise model. For example, using a positive real number A and the noise quantity $\sigma$ (x, y), the denoising processor 27f determines pixels whose $v_1$ (x, y) is greater than A$\sigma$ (x, y) belong to the moving region, and the others belong to the static region.

The denoising processor 27f then detects each pixel having $v_1$ (x, y) larger than the threshold (line 603) as a pixel of the motion region, and detects each pixel having $v_1$ (x, y) equal to or smaller than the threshold (line 603) as a pixel of the static region.

Hereby, in the moving image 601, for example, as illustrated on the right side of FIG. 7, a region 604 including the heart 601 and periphery thereof is detected as the motion region, and a region other than the region 604 is detected as the static region.

Thereafter, the denoising processor 27f reduces noise by different methods for each of the pixels included in the motion region and the pixels included in the static region. For example, the denoising processor 27f sets the intensity of noise removal for the pixels included in the motion region to be lower than the intensity of noise removal for the pixels included in the static region.

Figure 8:
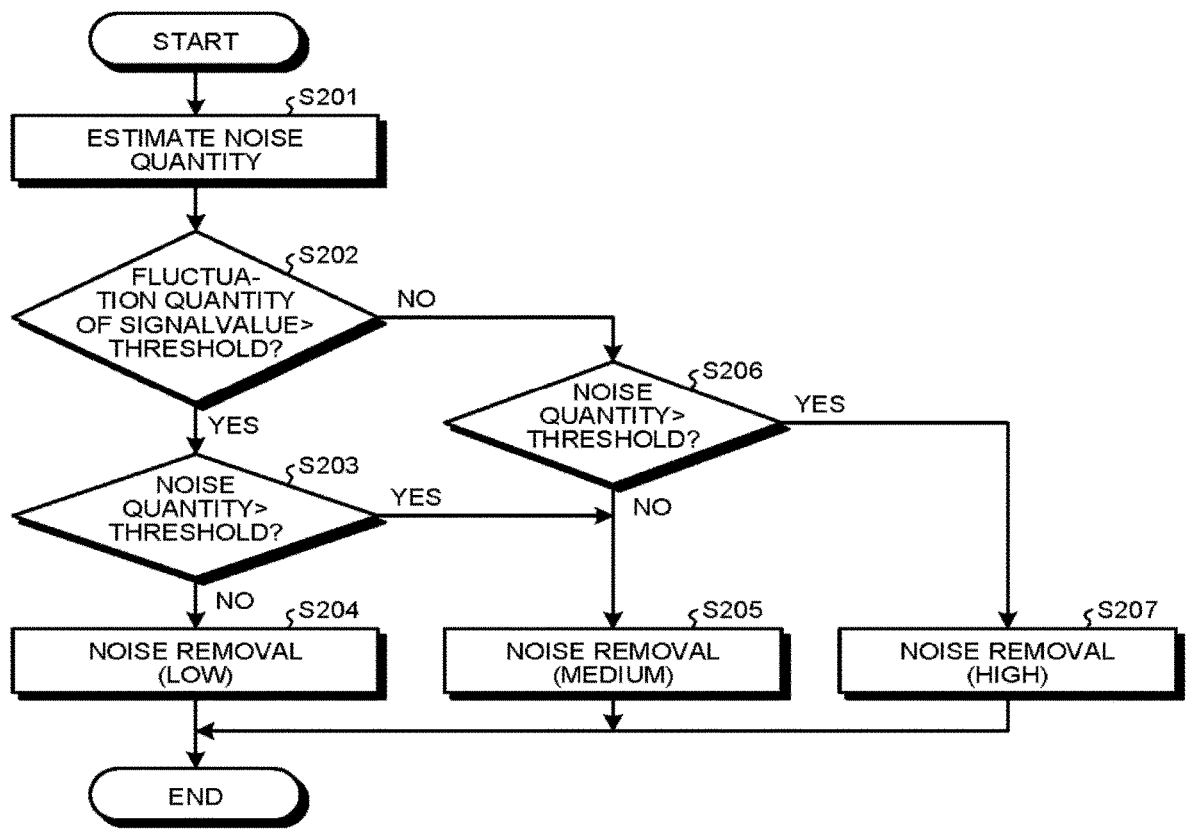
FIG. 8 is a flowchart illustrating processing procedures of noise removal according to an eleventh modification.

FIG. 8 is a flowchart illustrating processing procedures of noise removal according to the eleventh modification. The processing at Steps S201 to S207 illustrated in FIG. 8 corresponds to the processing at Step S110 illustrated in FIG. 3. Specifically, in the present modification, the processing at Steps S201 to S207 illustrated in FIG. 8 is performed after the processing similar to Steps S101 to S109 illustrated in FIG. 3 is performed. Thereafter, processing similar to Step S110 illustrated in FIG. 3 is performed.

For example, as illustrated in FIG. 8, the denoising processor 27f estimates a noise quantity of each pixel included in each frame of the moving image using a noise model F (s) selected by the model selector 27e (Step S201). Specifically, the denoising processor 27f determines an estimated value $\sigma$ (x, y) of the noise quantity in the coordinates (x, y) using the noise model F (s) for each of the frames, as described above.

Thereafter, the denoising processor 27f compares a numerical value indicating the magnitude of the temporal fluctuation quantity of the signal value with a threshold based on the estimated noise quantity, for each pixel in the same position included in the frames (Step S202). For example, the fluctuation quantity $v_1$ (x, y) of the signal value indicated in Expression (1) is used as the numerical value indicating the magnitude of the temporal fluctuation quantity of the signal value. For example, the threshold value is a value obtained by multiplying $\sigma$ (x, y) by a magnification of a predetermined constant. For example, the threshold is a value three times as large as $\sigma$ (x, y).

Thereafter, the denoising processor 27f determines a pixel having a larger numerical value indicating the magnitude of the fluctuation quantity of the signal value than the threshold value, as a pixel of the motion region (Yes at Step S202). By contrast, the denoising processor 27f determines a pixel having a smaller or equal numerical value indicating the magnitude of the fluctuation quantity of the signal value than or to the threshold value, as a pixel of the static region (No at Step S202).

Thereafter, the denoising processor 27f performs noise removal for each of the pixels of the motion region and the pixels of the static region. In the removal, the denoising processor 27f uses noise removal methods that are different between the motion region and the static region such that the intensity of noise removal for the pixels of the motion region is lower than the intensity of noise removal for the pixels of the static region.

For example, the denoising processor 27f performs noise removal by performing processing using a weighted average of only signals having a smaller or equal difference from s (x, y) than or to a threshold value, as disclosed in Non-patent Literature 1. In this case, for example, the denoising processor 27f sets a threshold Tm used for noise removal for the pixels of the motion region to be relatively lower than a threshold Ts used for noise removal for the pixels of the static region.

For example, the denoising processor 27f sets the threshold Tm for the motion region to "Tm=Cm*σ (x, y)", and sets the threshold Ts for the static region to "Ts=Cs*σ (x, y)". Each of Cm and Cs is a positive real number, and Cm and Cs satisfy "Cm<Cs".

In this manner, when the noise quantity is equal to or smaller than the threshold Tm (No at Step S203), the denoising processor 27f performs noise removal with a relatively low intensity for the pixels of the motion region (Step S204), by performing weighted averaging of the signal values. In addition, when the noise quantity is larger than the threshold Tm (Yes at Step S203), the denoising processor 27f performs noise removal with a relatively medium intensity for the pixels of the motion region (Step S205), by performing ordinary averaging of the signal values.

When the noise quantity is equal to or smaller than the threshold Ts (No at Step S206), the denoising processor 27f performs noise removal with a relatively medium intensity for the pixels of the static region (Step S205), by performing weighted averaging of the signal values. In addition, when the noise quantity is larger than the threshold Ts (Yes at Step S206), the denoising processor 27f performs noise removal with a relatively high intensity for the pixels of the static region (Step S207), by performing ordinary averaging of the signal values.

As described above, the signal of the motion region becomes hard to change due to noise removal, by setting the threshold Tm used for noise removal for the pixels of the motion region to be relatively lower than the threshold Ts used for noise removal for the pixels of the static region. This structure suppresses weakening of the signal in the motion region due to noise removal.

Further, as described above, the denoising processor 27f sets the intensity of noise removal for the pixels included in the motion region to be lower than the intensity of noise removal for the pixels included in the static region, when the pixels included in the motion region and the pixels included in the static region have the equal noise quantity obtained from the noise model.

In addition, the intensity of noise removal for the motion region is not necessarily less than the intensity of noise removal for the static region. For example, with respect to a point (x1, y1) on the motion region and a point (x2, y2) on the static region, when σ (x1, y1) is equal to σ (x2, y2), Cm is less than Cs and consequently Tm is less than Ts. However, when σ (x1, y1) is greater than Cs/Cm times of σ (x2, y2), Tm may be greater than Ts.

Further, the method for changing the intensity of noise removal between the motion region and the static region is not limited to the above method. For example, a method as disclosed in Non-patent Literature 3 may be used. In the method, the gain of a high frequency included in the filter for the motion region is set to be higher than the gain of a high frequency included in the filter for the static region, in time-direction filtering.

Second Embodiment

The above first embodiment illustrates an embodiment of an MRI apparatus, but the embodiments are not limited thereto. For example, a similar embodiment is applicable to an image processing apparatus that is connected to an MRI apparatus via a network to communicate therewith. The following is explanation of an embodiment of an image processing apparatus that is a second embodiment.

Figure 9:
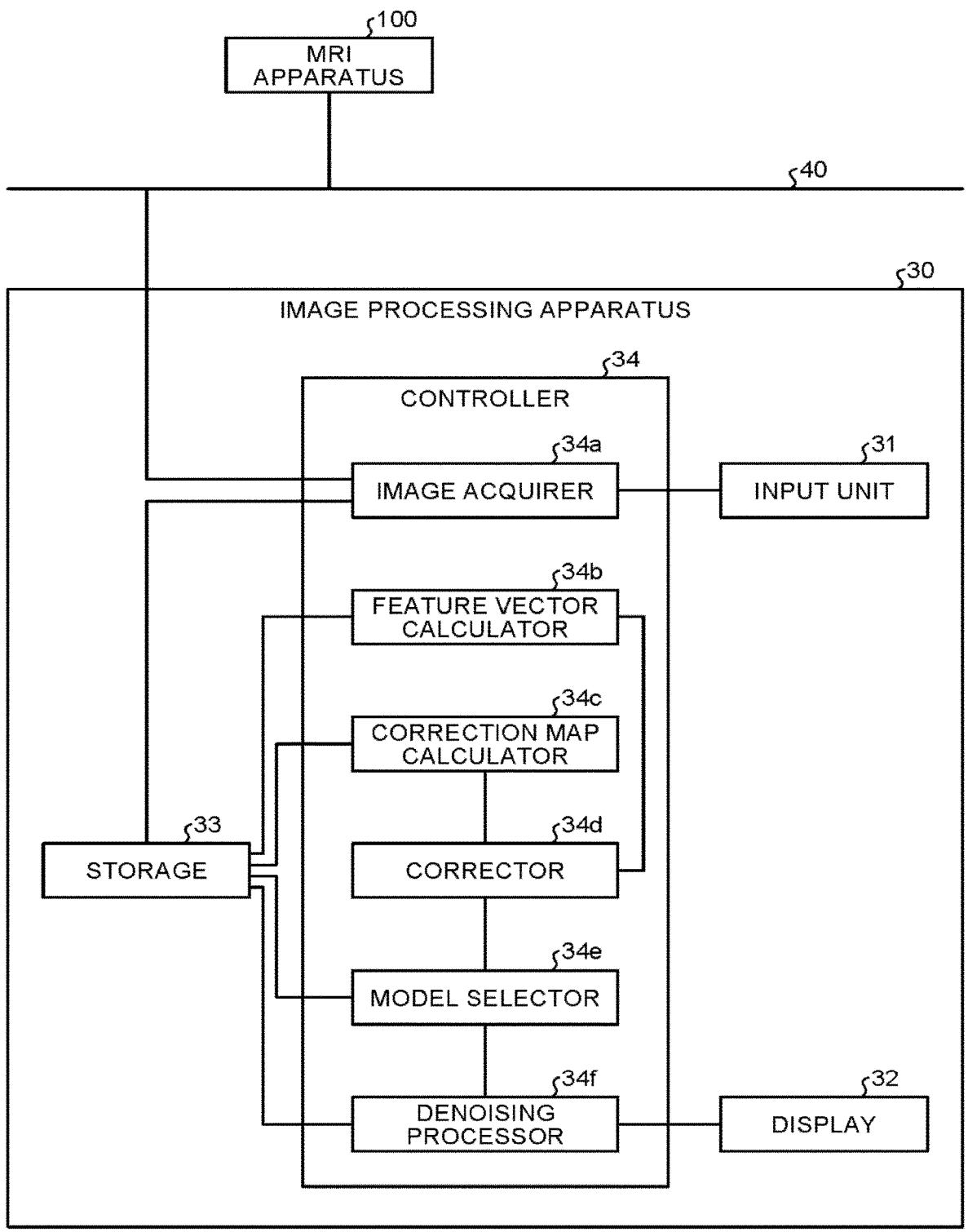
FIG. 9 is a block diagram illustrating a configuration of an image processing apparatus according to a second embodiment.

FIG. 9 is a block diagram illustrating a configuration of an image processing apparatus 30 according to the second embodiment. For example, as illustrated in FIG. 9, the image processing apparatus 30 is connected to the MRI apparatus 100 via a network 40 to communicate therewith. The image processing apparatus 30 includes an input unit 31, a display 32, a storage 33, and a controller 34. For example, the controller 34 includes an image acquirer 34a, a feature vector calculator 34b, a correction map calculator 34c, a corrector 34d, a model selector 34e, and a denoising processor 34f.

The image acquirer 34a performs communication with the MRI apparatus 100 via the network 40, to acquire an image photographed by the MRI apparatus 100. For example, the image acquirer 34a receives an operation to designate an image serving as a processing target from the operator via the input unit 31, and acquires the designated image and a sensitivity map of the receiving coil at the time of photographing the image from the MRI apparatus 100. The image acquirer 34a stores the acquired image and the sensitivity map in the storage 33.

The feature vector calculator 34b, the correction map calculator 34c, the corrector 34d, the model selector 34e, and the denoising processor 34f have structures and functions similar to the feature vector calculator 27b, the correction map calculator 27c, the corrector 27d, the model selector 27e, and the denoising processor 27f explained in the first embodiment, respectively.

In the second embodiment, the feature vector calculator 34b obtains an image generated by the image acquirer 34a from the storage 33, and calculates feature vectors for the respective pixels included in the obtained image. In the second embodiment, the denoising processor 34f displays a noise-removed image on the display 32. The denoising processor 34f may store the noise-removed image in the storage 33.

The image acquirer 34a may acquire sensitivity map MR signal data and diagnostic MR signal data that are collected in the same inspection, instead of acquiring an image and a sensitivity map from the MRI apparatus 100. In such a case, for example, the controller 34 generates a sensitivity map from the sensitivity map MR signal data and generates an image from the diagnostic MR signal data, in the same manner as the image generator 25 explained in the first embodiment, to store the generated sensitivity map and the image in the storage 33.

Among the elements described above, the controller 34 includes, for example, a processor such as a central processing unit (CPU) and a micro processing unit (MPU), a memory, or an electronic circuit such as application specific integrated circuits (ASIC) and a field programmable gate array (FPGA). In such a case, for example, the processor included in the controller 34 reads and executes a computer program that provides the processing procedure of the processing performed by the controller 34 from the storage 33, to perform processing in accordance with the processing procedure.

The image processing apparatus 30 according to the second embodiment described above can properly remove noise in all the pixels in an image photographed by the MRI apparatus 100, even when differences in S/N occurs among a plurality of pixels. This structure suppresses loss of a feature of a signal in the image photographed by the MRI apparatus 100 due to noise removal.

In the MRI apparatus or the image processing apparatus according to the above embodiments, the computer program stored in the storage may be installed in each apparatus in advance, or distributed in a storage medium such as a compact disc read only memory (CD-ROM) or via a network, to be installed in each apparatus, as appropriate. Otherwise, the program may be stored in a built-in or external hard disk in the apparatus, a memory, or a storage medium such as a compact disc recordable (CD-R), a compact disc rewritable (CD-RW), a digital versatile disc random access memory (DVD-RAM), and a digital versatile disc recordable (DVD-R), and read and executed by a processor included in each apparatus, as appropriate.

At least one of the embodiments described above can properly remove noise in all the pixels even when differences in S/N occur among a plurality of pixels included in the image.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
an MRI (magnetic resonance imaging) system including a receiving coil to receive magnetic resonance signals; and
processing circuitry configured to:
generate a plurality of images imaged at different times, based on the magnetic resonance signals, each of the plurality of images including a plurality of pixels;
calculate feature vectors of respective pixels included in one image of the plurality of images, the calculating the feature vectors includes calculating, as an element of each feature vector, a fluctuation quantity of a signal value for the respective pixel based on signal values of pixels included in the plurality of images;
correct the calculated feature vectors, including correcting the calculated fluctuation quantity of each feature vector based on a sensitivity of the receiving coil; and
reduce noise in the one image for output, based on distribution of the corrected feature vectors.

2. The apparatus according to claim 1, wherein
the processing circuitry is configured to correct the feature vectors of the respective pixels, further based on a geometry factor used in high-speed imaging.

3. The apparatus according to claim 1, wherein
the processing circuitry is configured to:
calculate a correction map based on the sensitivity of the receiving coil, and
correct the feature vectors of the respective pixels using the correction map.

4. The apparatus according to claim 3, wherein
a value of the correction map is calculated by dividing a value of the sensitivity of the receiving coil by a geometry factor used in high-speed imaging.

5. The apparatus according to claim 3, wherein
the correction map has a larger value in a position in which the receiving coil has higher sensitivity.

6. The apparatus according to claim 3, wherein
the correction map has a larger value in a position having lower calculation accuracy of a signal value in image reconstruction, when the one image is obtained by high-speed imaging in which a plurality of receiving coils are used and imaging is performed using difference in sensitivity among the receiving coils.

7. The apparatus according to claim 3, wherein
the processing circuitry is configured to correct at least one element of the feature vectors of the respective pixels such that an element corresponding to a position having a smaller value in the correction map has a smaller value and an element corresponding to a position having a larger value in the correction map has a larger value.

8. The apparatus according to claim 3, wherein
the processing circuitry is configured to decrease an intensity of noise removal as a value of the correction map increases.

9. The apparatus according to claim 1, wherein
the processing circuitry is configured to:
select a noise model from a plurality of noise models, based on the corrected feature vectors, and
reduce the noise in the one image using the selected noise model.

10. The apparatus according to claim 9, wherein
the noise model outputs a noise quantity for an input signal value, outputs a smaller noise quantity as the input signal value is smaller, and outputs a larger noise quantity as the input signal value is larger, and the output noise quantity converges to a fixed value as the input signal value increases.

11. The apparatus according to claim 9, wherein
the processing circuitry is configured to select the noise model that most approximates to a data point group indicated by the corrected feature vectors, from the plurality of noise models.

12. The apparatus according to claim 9, wherein
the processing circuitry is configured to increase an intensity of noise removal as a noise quantity that is output from the selected noise model increases.

13. The apparatus according to claim 9, wherein
the processing circuitry is configured to:
generate a moving image as the plurality of images,
detect a motion region and a static region including movement smaller than movement in the motion region from the moving image, and
reduce noise by different methods for the motion region and the static region.

14. The apparatus according to claim 13, wherein
the processing circuitry is configured to detect one of the plurality of pixels having a larger temporal fluctuation quantity of a signal value of the one of the plurality of pixels in an identical position in a plurality of frames included in the moving image than a threshold based on a noise quantity obtained from the noise model, as a pixel of the motion region.

15. The apparatus according to claim 13, wherein
the processing circuitry is configured to set an intensity of noise removal for pixels included in the motion region to be lower than an intensity of noise removal for pixels included in the static region, when the pixels included in the motion region and the pixels included in the static region have an equal noise quantity obtained from the noise model.

16. The apparatus according to claim 1, wherein
the processing circuitry is configured to calculate the fluctuation quantity of the signal value for the respective pixel, based on the signal value of the respective pixel and signal values of other pixels located in positions spatially or temporally close to the respective pixel.

17. The apparatus according to claim 1, wherein
each feature value vector includes a plurality of elements.

18. The apparatus according to claim 17, wherein
the fluctuation quantity comprises a standard deviation of a respective signal value.

19. An image processing apparatus, comprising:
a processor; and
a memory that stores processor-executable instructions that, when executed by the processor, cause the processor to:
 acquire a plurality of images imaged at different times and generated based on magnetic resonance signals, each of the plurality of images including a plurality of pixels;
 calculate feature vectors of respective pixels included in one image of the plurality of images, the calculating the feature vectors includes calculating, as an element of each feature vector, a fluctuation quantity of a signal value for the respective pixel based on signal values of pixels included in the plurality of images;
 correct the calculated feature vectors, including correcting the calculated fluctuation quantity of each feature vector based on a sensitivity of the receiving coil to receive the magnetic resonance signal; and
 reduce noise in the one image for output based on distribution of the corrected feature vectors.

20. An image processing method, comprising:
acquiring a plurality of images imaged at different times and generated based on magnetic resonance signals, each of the plurality of images including a plurality of pixels;
calculating feature vectors of respective pixels included in one image of the plurality of images, the calculating the feature vectors includes calculating, as an element of each feature vector, a fluctuation quantity of a signal value for the respective pixel based on signal values of pixels included in the plurality of images;
correcting the calculated feature vectors, including correcting the calculated fluctuation quantity of each feature vector based on a sensitivity of the receiving coil to receive the magnetic resonance signal; and
reducing noise in the one image for output based on distribution of the corrected feature vectors.

* * * * *